(12) United States Patent
Suzuka

(10) Patent No.: US 10,243,028 B2
(45) Date of Patent: Mar. 26, 2019

(54) ORGANIC ELECTROLUMINESCENT ELEMENT AND LIGHTING DEVICE WITH BUFFER LAYER

(71) Applicant: PANASONIC INTELLECTUAL PROPERTY MANAGEMENT CO., LTD., Osaka (JP)

(72) Inventor: Yuko Suzuka, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/127,238

(22) PCT Filed: Feb. 27, 2015

(86) PCT No.: PCT/JP2015/001040
§ 371 (c)(1),
(2) Date: Sep. 19, 2016

(87) PCT Pub. No.: WO2015/155924
PCT Pub. Date: Oct. 15, 2015

(65) Prior Publication Data
US 2017/0110523 A1    Apr. 20, 2017

(30) Foreign Application Priority Data

Apr. 8, 2014  (JP) ................. 2014-079680

(51) Int. Cl.
*H01L 27/32*  (2006.01)
*H01L 51/52*  (2006.01)

(52) U.S. Cl.
CPC ...... *H01L 27/3239* (2013.01); *H01L 51/5206* (2013.01); *H01L 51/5234* (2013.01);
(Continued)

(58) Field of Classification Search
CPC ............. H01L 27/3239; H01L 51/5281; H01L 51/5268; H01L 51/5206; H01L 51/5234; H01L 2251/5361; H01L 2251/5323
See application file for complete search history.

(56) References Cited

U.S. PATENT DOCUMENTS 6,181,062 B1    1/2001  Hiraishi et al.
2002/0175620 A1* 11/2002  Yokoyama .......... H01L 27/3223
                                                        313/505
(Continued)

FOREIGN PATENT DOCUMENTS

JP    61-146894    9/1986
JP    06-052990    2/1994
(Continued)

OTHER PUBLICATIONS

International Search Report (ISR) from International Searching Authority (Japan Patent Office) in International Pat. Appl. No. PCT/JP2015/001040, dated Apr. 21, 2015.
(Continued)

*Primary Examiner* — Jay C Chang
(74) *Attorney, Agent, or Firm* — Greenblum & Bernstein P.L.C.

(57) ABSTRACT

An organic EL element includes: a substrate that is light-transmissive; a pair of electrode layers (first electrode layer and second electrode layer) disposed above the substrate, at least one of the pair of electrode layers being light-transmissive; and a planar light-emitting layer disposed between the first electrode layer and second electrode layer. The first electrode layer is disposed in a first region in a plan view. The organic EL element further includes a buffer layer disposed, in a plan view, in a second region adjacent the first region. The buffer layer is for reducing a difference in an
(Continued)

optical characteristic between the first region and the second region with respect to a predetermined light.

20 Claims, 12 Drawing Sheets

(52) U.S. Cl.
CPC ...... *H01L 51/5268* (2013.01); *H01L 51/5281* (2013.01); *H01L 2251/5323* (2013.01); *H01L 2251/5361* (2013.01)

(56) References Cited

U.S. PATENT DOCUMENTS

| | | | | |
|---|---|---|---|---|
| 2008/0278067 | A1* | 11/2008 | Tyan | B82Y 20/00 313/504 |
| 2014/0077189 | A1 | 3/2014 | Kugler et al. | |
| 2014/0246664 | A1* | 9/2014 | Shoda | H01L 27/3288 257/40 |

FOREIGN PATENT DOCUMENTS

| | | |
|---|---|---|
| JP | 08-185984 | 7/1996 |
| JP | 2000-231985 | 8/2000 |
| JP | 2007-094165 | 4/2007 |
| JP | 2009-094003 | 4/2009 |
| JP | 2010-177007 | 8/2010 |
| JP | 2012-134312 | 7/2012 |
| JP | 2014-514751 | 6/2014 |
| WO | 96/34514 A1 | 10/1996 |
| WO | 2001/078461 | 10/2001 |
| WO | 2012/131314 A1 | 10/2012 |

OTHER PUBLICATIONS

Office Action issued in Japan Counterpart Patent Appl. No. 2016-512577, dated Aug. 22, 2017.

* cited by examiner

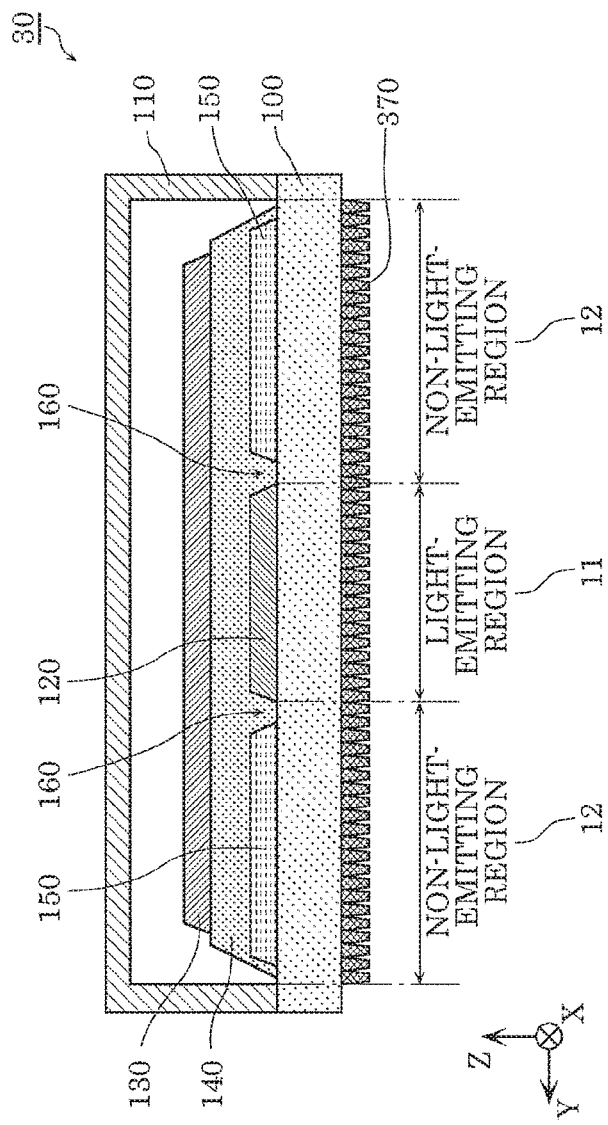

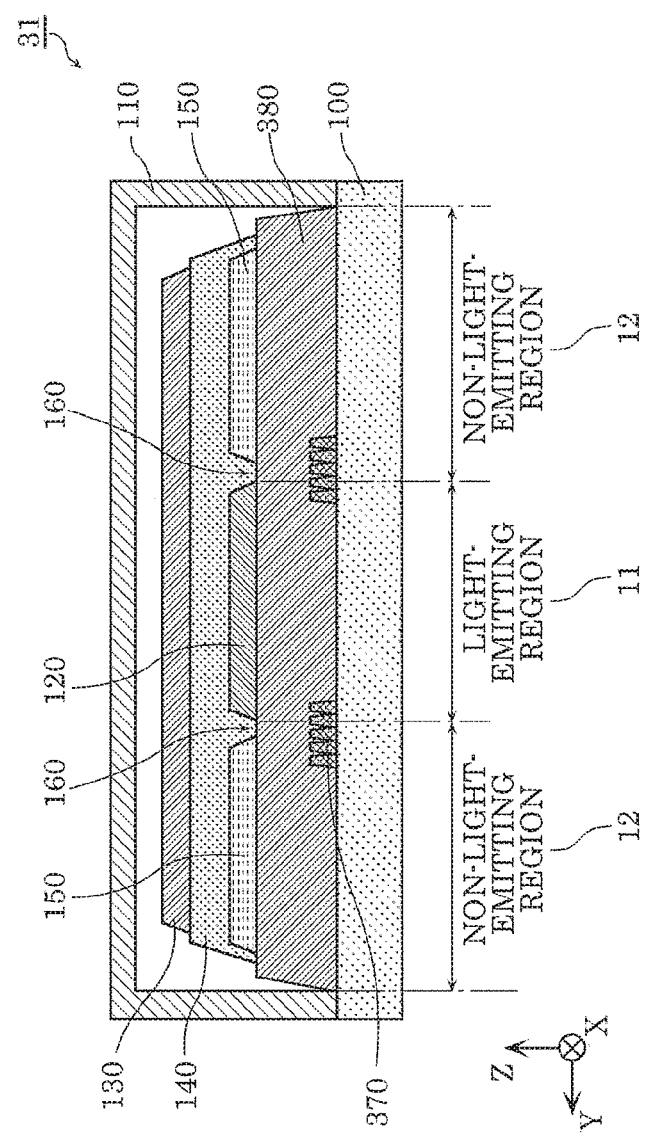

ORGANIC ELECTROLUMINESCENT ELEMENT AND LIGHTING DEVICE WITH BUFFER LAYER

TECHNICAL FIELD

The present invention relates to an organic electroluminescent (EL) element and a lighting device including an organic EL element.

BACKGROUND ART

Conventionally, various devices which include an organic EL element have been developed. For example, Patent Literature (PTL) 1 discloses an organic EL display device including an organic EL element.

The organic EL display device disclosed in PTL 1 includes a pair of electrodes, an organic EL layer provided between the pair of electrodes, and a pattern disposed on surfaces on both sides of the main body. The organic EL display device further includes: a light-shielding layer that is disposed between a light-emitting unit and the pattern and leaves a light-emitting region exposed and shields a non-light-emitting region; a circular polarizing plate that covers all surfaces of the light-emitting unit and non-light-emitting unit; and a semi-transmissive, semi-reflective layer that covers all surfaces of the light-emitting unit and non-light-emitting unit. With this, a reduction in contrast of the pattern layer can be inhibited.

CITATION LIST

Patent Literature

PTL 1: Japanese Unexamined Patent Application Publication No. 2009-094003

SUMMARY OF THE INVENTION

Technical Problem

However, with the conventional organic EL display device described above, since the non-light-emitting region is shielded, the shape of the light-emitting region in the light-emitting surface is visible even at times when light is not being emitted. In other words, a natural light-emitting surface cannot be displayed at times when light is not being emitted. Note that a "light-emitting surface" is a planar surface including a light-emitting region and a non-light-emitting region.

In light of this, the present invention provides an organic EL element and a lighting device capable of displaying a natural light-emitting surface at times when light is not being emitted.

Solution to Problem

In order to solve the above-described problem, an organic EL element according to one aspect of the present invention includes: a substrate that is light-transmissive; a pair of electrode layers disposed above the substrate, at least one of the pair of electrode layers being light-transmissive; and a planar light-emitting layer disposed between the pair of electrode layers. One of the pair of electrode layers is disposed in a first region in a plan view. The organic EL element further includes a buffer layer disposed, in a plan view, in a second region adjacent the first region. The buffer layer is for reducing a difference in an optical characteristic between the first region and the second region with respect to a predetermined light.

Advantageous Effect of Invention

With the organic EL element and lighting device according to the present invention, it is possible to display a natural light-emitting surface at times when light is not being emitted.

BRIEF DESCRIPTION OF DRAWINGS

FIG. 5A is a cross sectional view of an organic EL element according to Embodiment 3 of the present invention.

FIG. 5B is a cross sectional view of another example of an organic EL element according to Embodiment 3 of the present invention.

FIG. 7 illustrates in (a) and (b) an example of when the organic EL element according to Embodiment 4 of the present invention is turned on.

FIG. 10 illustrates in (a) and (b) an example of when the lighting device according to Embodiment 6 of the present invention is turned on.

Figure 1A:
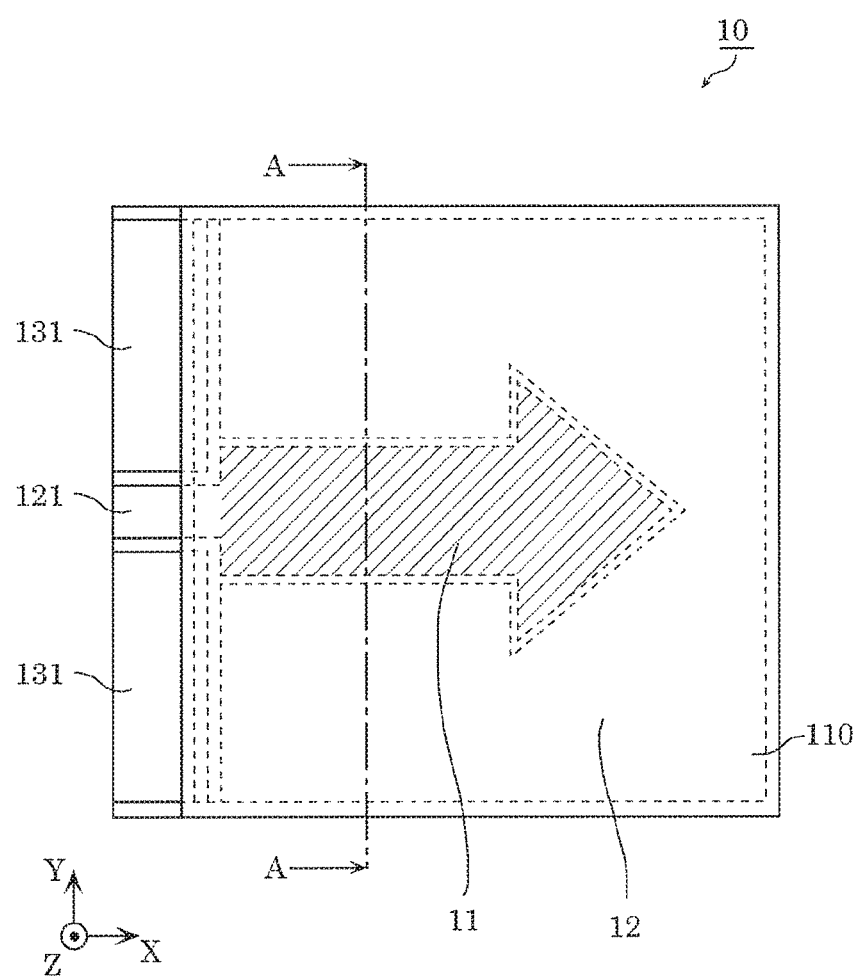
FIG. 1A is a top view of an organic EL element according to Embodiment 1 of the present invention.

DESCRIPTION OF EXEMPLARY EMBODIMENTS (Underlying Knowledge Forming Basis of Present Invention)

The inventor discovered the following problems with the organic EL element and the lighting device discussed in the above background art section.

With the conventional organic EL element, for example, by forming at least one of the pair of electrodes is formed in a predetermined shape (for example, in the shape of a letter, character or symbol), it is possible to emit light in the predetermined shape. In other words, with the organic EL element, it is possible to achieve a light-emitting region and a non-light-emitting region in a planar surface by forming at least one of the pair of electrodes into a predetermined shape.

However, in this case, the light-emitting region and the non-light-emitting region differ in regard to the presence or absence of an electrode film and an organic film. Since the transmittance of light changes depending on the presence or absence of the electrode film and the organic film, there is a problem that the shape of the light-emitting region (the design in which light is emitted) is visible at times when light is not being emitted.

In order to solve the above-described problem, an organic EL element according to one aspect of the present invention includes: a substrate that is light-transmissive; a pair of electrode layers disposed above the substrate, at least one of the pair of electrode layers being light-transmissive; and a planar light-emitting layer disposed between the pair of electrode layers. One of the pair of electrode layers is disposed in a first region in a plan view. The organic EL element further includes a buffer layer disposed, in a plan view, in a second region adjacent the first region. The buffer layer is for reducing a difference in an optical characteristic between the first region and the second region with respect to a predetermined light.

For example, this makes it possible to inhibit visibility of the shape of the first region at times when light is not being emitted since the buffer layer reduces a difference in an optical characteristic between the first region and the second region. This in turn makes it possible to achieve a natural light-emitting surface at times when light is not being emitted—that is to say, display a planar surface which does not appear out of place to the viewer at times when light is not being emitted since the design in which light is emitted is substantially not visible.

The following describes an organic EL element and lighting device according to embodiments of the present invention with reference to the drawings. Note that the each embodiment described below shows a specific, preferred example of the present invention. The numerical values, shapes, materials, elements, the arrangement and connection of the elements, etc., in the following embodiments are mere examples, and therefore do not intend to limit the present invention. Therefore, among elements in the following embodiments, those not recited in any of the independent claims defining the most generic part of the inventive concept are described as optional elements.

Note that the drawings are represented schematically and are not necessarily precise illustrations. Additionally, like reference marks indicate like elements in the drawings.

Embodiment 1

(Organic EL Element)

Figure 1B:
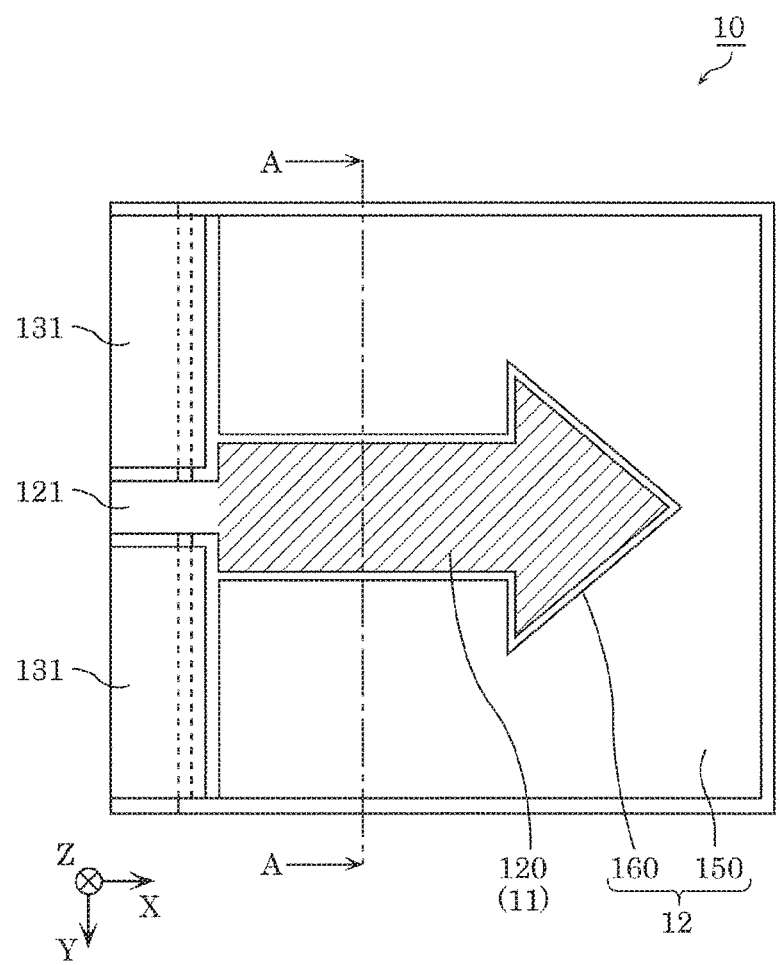
FIG. 1B is a bottom view of the organic EL element according to Embodiment 1 of the present invention.
Figure 2:
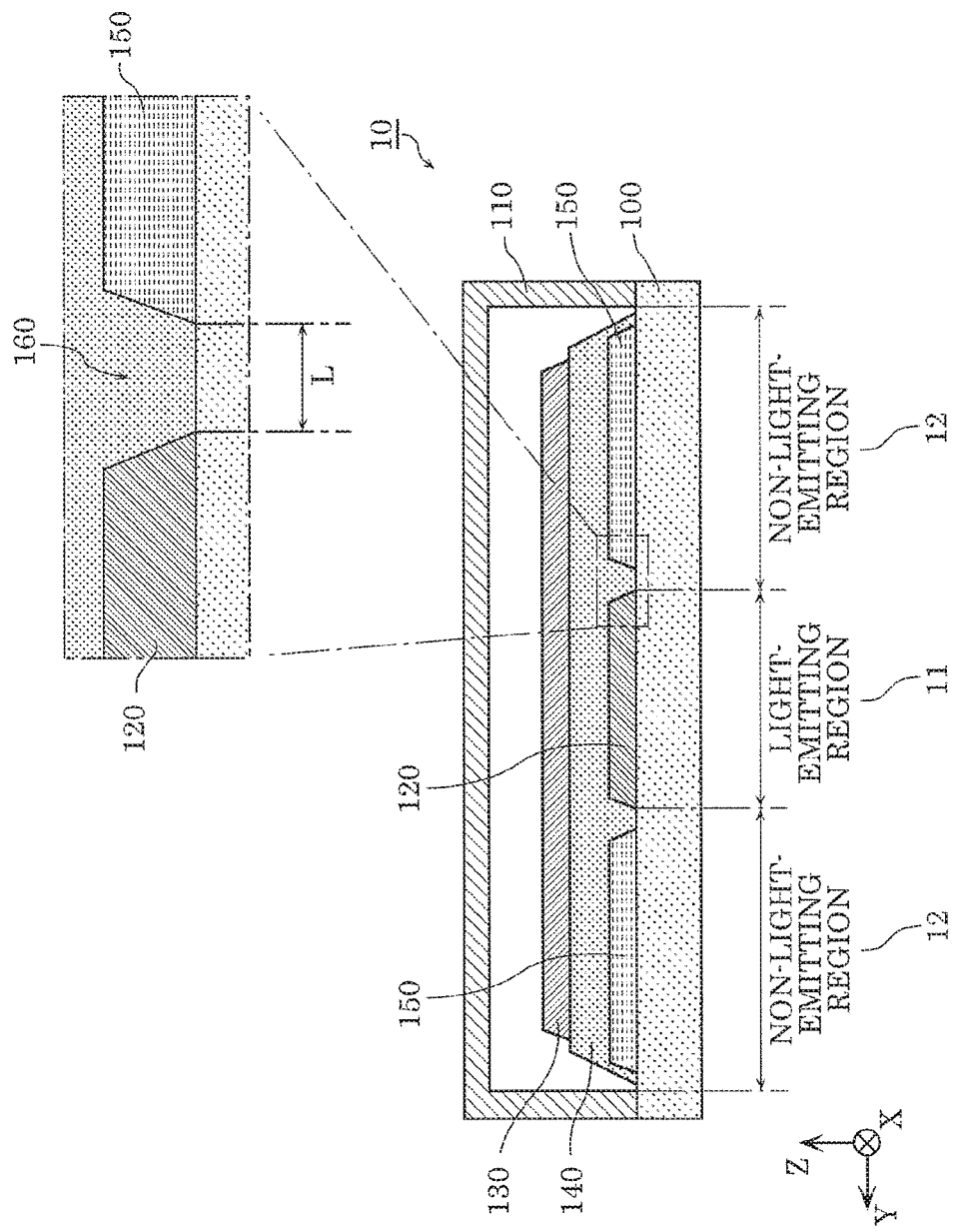
FIG. 2 is a cross sectional view of the organic EL element according to Embodiment 1 of the present invention.

First, the organic EL element (planar light-emitting body) according to Embodiment 1 of the present invention will be described with reference to FIG. 1A, FIG. 1B and FIG. 2. FIG. 1A and FIG. 1B are views illustrating organic EL element 10 according to this embodiment from above and below, respectively. FIG. 2 is a cross sectional view of organic EL element 10 according to this embodiment. Note that FIG. 1B is a view of organic EL element 10 from below, but does not illustrate substrate 100. Moreover, the cross section illustrated in FIG. 2 is taken along line A-A illustrated in FIG. 1A and FIG. 1B.

Note that in the drawings, the X axis and the Y axis are parallel to the light-emitting surface of organic EL element 10 and are perpendicular to one another, and the Z axis is perpendicular to the light-emitting surface of organic EL element 10.

As illustrated in FIG. 1A and FIG. 1B, organic EL element 10 according to this embodiment includes, in a plan view, first region 11 and second region 12. First region 11 and second region 12 are adjacent one another in-plane in organic EL element 10.

More specifically, first region 11 is a light-emitting region of organic EL element 10 in a plan view, and second region 12 is a non-light-emitting region of organic EL element 10 in a plan view. In other words, when viewed in a plan view, organic EL element 10 emits light in first region 11 and does not emit light in second region 12. In the example illustrated in FIG. 1A and FIG. 1B, first region 11 is surrounded by second region 12.

As illustrated in FIG. 2, organic EL element 10 includes a pair of substrates 100 and 110, a pair of electrode layers (first electrode layer 120 and second electrode layer 130), planar light-emitting layer 140, and buffer layer 150. Organic EL element 10 also includes electrically insulating groove 160 between first electrode layer 120 and buffer layer 150.

Note that, as illustrated in FIG. 1B, first region 11 is a region in which first electrode layer 120 is disposed. More specifically, first region 11 is a region defined by first electrode layer 120. In other words, the shape of first region 11 and the plan view shape of first electrode layer 120 are substantially the same.

Second region 12 is a region in which first electrode layer 120 is not disposed in a plan view. More specifically, second region 12 is a region in which buffer layer 150 and electrically insulating groove 160 are disposed.

Moreover, as illustrated in FIG. 1A, organic EL element 10 also includes terminals 121 and 131. Although not illustrated in the drawings, terminals 121 and 131 are disposed on substrate 100. Terminals 121 and 131 are extraction electrodes for supplying power to first electrode layer 120 and second electrode layer 130, respectively.

(Pair of Substrates)

Substrates 100 and 110 are a pair of substrates disposed such that major surfaces thereof face one another.

Substrate 100 is a substrate that is light-transmissive. For example, substrate 100 is a light-transmissive substrate that transmits at least some rays of visible light. The major surface of substrate 100 on a reverse side relative to the major surface that faces substrate 110 (i.e., the bottom surface of substrate 100 in FIG. 2) is a light-emitting surface.

For example, substrate 100 is a glass substrate including soda-lime glass, alkali-free glass, non-luminescent glass, phosphoric acid glass, or boric acid glass. Alternatively, substrate 100 may be a quartz or plastic substrate. Moreover, substrate 100 may be a substrate including particles, powder, or air pockets whose refractivity is different from that of the base material of the substrate, and alternatively may be a substrate that diffuses light due to formation of a texture on the surface of the substrate.

Substrate 110 is a sealing substrate for sealing planar light-emitting layer 140 in conjunction with substrate 100. End portions of substrate 110 are fixed to substrate 100 by, for example, a sealing material (not illustrated in the drawings).

More specifically, substrate 110 is a substrate in the form of a box whose bottom surface is open. Side walls are fixed to substrate 100 by, for example, a sealing material, and extend downward (i.e., in the positive direction of the Z axis) from the end portions of the main surface of substrate 110. In other words, substrate 110 is a substrate having a recess in which planar light-emitting layer 140 is disposed. The recess is, for example, formed by carving out substrate material from a plate-shaped substrate.

Substrate 110 is a substrate that is light-transmissive. For example, substrate 110 is a light-transmissive substrate that transmits at least some rays of visible light. More specifically, substrate 110 is a glass, quartz, or plastic substrate. Note that substrate 110 may be non-light-transmissive, and may include metal such as stainless steel, aluminum, or copper. Since substrate 100 and substrate 110 have the same composition, they have the same rate of thermal expansion, which means cracks and sealing defects can be inhibited.

Note that the sealing material used to connect substrate 100 and substrate 110 is, for example, a light curing resin such as epoxy resin, acrylic resin, or silicon resin. Alternatively, sealing material may be a thermal curing resin, a two-part curing resin, or thermoplastic resin such as polyethylene or polypropylene. For example, an internal space can be sealed off by applying a sealing material to one of substrates 100 and 100 and bonding and curing substrates 100 and 110 together.

Note that the space between substrates 100 and 110 may be filled with, for example, resin (filler resin, filler material). This allows for planar light-emitting layer 140 to be sealed even more tightly. If the space is filled with resin, contact between substrate 100 and substrate 110 can be inhibited, which makes it more reliable than when no recess is formed in substrate 110.

(Pair of Electrode Layers)

First electrode layer 120 and second electrode layer 130 are a pair of electrode layers that are disposed above substrate 100. At least one of the pair of electrode layers is light-transmissive.

First electrode layer 120 is an electrode that is disposed on the light-emitting surface side. For example, first electrode layer 120 is disposed on substrate 100. First electrode layer 120 is, for example, an anode, and when planar light-emitting layer 140 is emitting light, voltage is applied to first electrode layer 120 that is higher than the voltage applied to second electrode layer 130.

First electrode layer 120 includes an electrically conductive material that is light-transmissive. For example, first electrode layer 120 includes a light-transmissive, electrically conductive material that transmits at least some rays of visible light. First electrode layer 120 includes, for example, indium tin oxide (ITO), indium zinc oxide (IZO), or aluminum zinc oxide (AZO). Note that first electrode layer 120 may be a metal thin film, such as a film of silver or aluminum that is thin enough to transmit light. First electrode layer 120 may be made by dispersing silver nanowires or silver particles. Moreover, first electrode layer 120 may include electrically conductive high molecules such as PEDOT or polyaniline, electrically conductive high molecules doped with, for example, a given acceptor, or an electrically conductive, light-transmissive material such as carbon nanotubes. For example, first electrode layer 120 is formed by forming a light-transmissive, electrically conductive film on substrate 100 by deposition, application or sputtering, and patterning the formed light-transmissive, electrically conductive film.

First electrode layer 120 is disposed in first region 11. With organic EL element 10 according to this embodiment, only the region of planar light-emitting layer 140 sandwiched by first electrode layer 120 and second electrode layer 130 emits light. In other words, the plan view shape of first electrode layer 120 corresponds to the light-emitting region (first region 11).

Thus, by patterning first electrode layer 120 into a predetermined shape, planar light-emitting layer 140 can be made to emit light in the predetermined shape. In this embodiment, for example, first electrode layer 120 is patterned into the shape of an arrow, as illustrated in FIG. 1A and FIG. 1B. Note that the plan view shape of first electrode layer 120 is not limited to this example. For example, the plan view shape of first electrode layer 120 may be a predetermined letter, character, number, symbol, graphic, or design. The patterning may be performed by etching after the forming of the film. Moreover, by patterning the film using a mask, low-cost manufacturing is possible. Moreover, various kinds of patterns can be easily formed by, for example, directly cutting with a laser.

Note that first electrode layer 120 is electrically connected to terminal 121. As illustrated in FIG. 1B, terminal 121 is disposed so as to be an extension of part of first electrode layer 120.

For example, terminal 121 is formed by patterning an electrically conductive film in the same process as first electrode layer 120. Thus, for example, terminal 121 includes the same material as first electrode layer 120. Note that terminal 121 may be formed in a different process from first electrode layer 120, and may include a different material than first electrode layer 120. For example, terminal 121 and terminal 131 may be formed at the same time.

Second electrode layer 130 is an electrode that is disposed on a side opposite the light-emitting surface side. For example, second electrode layer 130 is disposed on planar light-emitting layer 140. Second electrode layer 130 is, for example, a cathode, and when planar light-emitting layer 140 is emitting light, voltage is applied to second electrode layer 130 that is lower than the voltage applied to first electrode layer 120.

Second electrode layer 130 is a reflective electrode that reflects light. Second electrode layer 130 reflects light emitted by planar light-emitting layer 140 and emits light to the light-emitting surface side.

Second electrode layer 130 includes aluminum, silver, or magnesium, or an alloy including at least one of aluminum, silver, and magnesium. For example, second electrode layer 130 is formed by forming an electrically conductive film on planar light-emitting layer 140 by deposition, application or sputtering.

Note that second electrode layer 130 is electrically connected to terminal 131. More specifically, terminal 131 is disposed so as to be an extension of part of second electrode layer 130 along the edge surface of planar light-emitting layer 140. In other words, the extended portion of second electrode layer 130 covers the edge surface of planar light-emitting layer 140. More specifically, terminal 131 is formed by patterning an electrically conductive film in the same process as second electrode layer 130. Thus, for example, terminal 131 includes the same material as second electrode layer 130. Note that terminal 131 may be formed in a different process from second electrode layer 130, and may be formed of a different material than second electrode layer 130.

(Planar Light-emitting Layer)

Planar light-emitting layer 140 is one example of a light-emitting unit provided between the pair of electrode layers (first electrode layer 120 and second electrode layer 130). Planar light-emitting layer 140 emits light in a plane as a result of voltage being applied between first electrode layer 120 and second electrode layer 130. More specifically, the light-emitting region of planar light-emitting layer 140—that is to say, only first region 11—emits light.

Even more specifically, planar light-emitting layer 140 includes a hole injection layer, a hole transport layer, a light-emitting layer (organic EL layer), an electron transport layer, and an electron injection layer. Organic layers such as the light-emitting layer include, for example, an organic material such as diamine, anthracene, or a metal complex. For example, when planar light-emitting layer 140 is to emit white light, three dopant pigments—red, green, and blue—may be doped in the light-emitting layer, or planar light-emitting layer 140 may be formed as a stacked layer structure including a hole transport blue light-emitting layer, an electron transport green light-emitting layer, and an electron transport red light-emitting layer. Moreover, planar light-emitting layer 140 may be configured to have a multi-unit structure in which red, blue, and green light-emitting units may be stacked with light-transmissive, electrically conductive intermediate layers therebetween so as to be directly electrically connected. Each layer in the planar light-emitting layer 140 is formed by, for example, a deposition, spin coat, or casting method.

(Buffer Layer)

Buffer layer 150 is disposed in second region 12 and reduces a difference in an optical characteristic (i.e., reduces optical contrast) between first region 11 and second region 12 with respect to a predetermined light. More specifically, buffer layer 150 reduces a difference in an optical characteristic between first region 11 (the light-emitting region) and second region 12 (the non-light-emitting region) of organic EL element 10 with respect to a predetermined light more so than when buffer layer 150 is not provided. Buffer layer 150 is not provided in the light-emitting region; buffer layer 150 is only provided in the non-light-emitting region.

Predetermined light is external light incident on organic EL element 10 from substrate 100 at times when light is not being emitted. Predetermined light is, more specifically, light of a predetermined wavelength, such as any RGB value. Moreover, predetermined light may be light emitted by a typical organic EL lamp having a white light peak wavelength.

When a user views organic EL element 10 from the light-emitting surface side at times when light is not being emitted, light reflected off second electrode layer 130 is visible. More specifically, in first region 11 (the light-emitting region), light from substrate 100, first electrode layer 120, and planar light-emitting layer 140 and back is visible to the user. In second region 12 (the non-light-emitting region), light from substrate 100, buffer layer 150, and planar light-emitting layer 140 and back is visible to the user.

Moreover, the light-emitting surface of substrate 100 and the interfaces of the layers partially reflect light which is then visible to the user. The different light rays reflected in first region 11 and second region 12 are light rays reflected off the top surface or the bottom surface of first electrode layer 120, and the light rays reflected off the top surface or the bottom surface of buffer layer 150.

Therefore, the difference in an optical characteristic between first region 11 and second region 12 is equivalent to the difference between an optical characteristic of first electrode layer 120 and an optical characteristic of buffer layer 150. Therefore, buffer layer 150 reduces the difference in an optical characteristic between first electrode layer 120 and itself.

For example, buffer layer 150 reduces a difference in an optical characteristic between first region 11 second region 12 with respect to a predetermined light to 15% or less. If the difference in an optical characteristic is 15% or less, for example, a person with 1.0 vision cannot recognize this difference when the background luminance is 1000 cd/m² (typical luminance for organic EL lamps).

Next, the optical characteristic that buffer layer 150 according to this embodiment reduces will be discussed. The optical characteristic is, more specifically, optical path length and absorption spectrum.

(Optical Path Length)

Optical path length is one example of an optical characteristic. Buffer layer 150 reduces a difference in phase produced by a difference in optical path length between first region 11 and second region 12 with respect to a predetermined light. More specifically, buffer layer 150 reduces a difference in phase produced by a difference in optical path length between the light-emitting region and the non-light-emitting region. The difference in phase produced by a difference in optical path length between light-emitting region and light-emitting region corresponds to the difference between the phase corresponding to the optical path length of first electrode layer 120 and the phase corresponding to the optical path length of buffer layer 150.

Optical path length is optical path length relative to light traveling in the direction in which the layers are layered, and more specifically, is the product of refractive index n and thickness d. Phase difference is equal to (optical path length difference)/$2\pi/\lambda$. Here, $\lambda$ is a wavelength included in external light incident on organic EL element 10. However, when (optical path length difference)>$\lambda$, the phase difference is equal to {(optical path length difference)−m×$\lambda$}/$2\pi/\lambda$. Here, m is an integer. Buffer layer 150 reduces a difference in phase produced by a difference in optical path length between first electrode layer 120 and itself.

For example, when the refractive index of first electrode layer 120 is n1 and the thickness of first electrode layer 120 is d1, the optical path length of first electrode layer 120 is equal to n1×d1. Here, when buffer layer 150 includes a material having a refractive index of n2, buffer layer 150 is designed to have a thickness d2 that reduces the difference between the optical path length n1×d1 of first electrode layer 120 and the optical path length n2×d2 of buffer layer 150. More specifically, buffer layer 150 may be designed to have a thickness d2 that is approximately equal to d1×(n1/n2). For example, d2 may be a value that is in a range from 0.85 to 1.15 times the result of d1×(n1/n2).

For example, when the refractive index n1 of first electrode layer 120 is 2.0 and the thickness d1 of first electrode layer 120 is 100 nm, the optical path length of first electrode layer 120 is 200 nm. On the other hand, when the refractive index n2 of buffer layer 150 is 1.9 and the thickness d2 of buffer layer 150 is 90 nm, the optical path length of buffer layer 150 is 171 nm.

With this, when light whose wavelength is 500 nm is incident in the direction in which the layers are layered, the phase difference between the light-emitting region and the non-light-emitting region when buffer layer 150 is not provided in the non-light-emitting region is (200/500)/$2\pi$. In contrast, when buffer layer 150 is provided in the non-light-emitting region, the phase difference between the light-emitting region and the non-light-emitting region is (200−171)/500/$2\pi$. Thus the reduced difference in phase produced by a difference in optical path length between the light-emitting region and the light-emitting region by buffer layer 150 is less than the difference when buffer layer 150 is not provided.

Note that the thickness d2 of buffer layer 150 may be determined such that the optical path length of first electrode layer 120 and the optical path length of buffer layer 150 match. In other words, the thickness d2 of buffer layer 150 may be equal to d1×(n1/n2). This makes it possible to inhibit an interference pattern from forming between the light-emitting region and the non-light-emitting region.

For example, buffer layer 150 includes the same material as first electrode layer 120 and has the same thickness as first electrode layer 120. Since buffer layer 150 includes the same material as first electrode layer 120, the refractive index n2 of buffer layer 150 is the same as the refractive index n1 of first electrode layer 120. Moreover, sine the thickness d2 of buffer layer 150 is the same as the thickness d1 of first electrode layer 120, the optical path length of buffer layer 150 is the same as the optical path length of first electrode layer 120. Accordingly, there is substantially zero difference in phase produced by a difference in optical path length between first electrode layer 120 and buffer layer 150.

Moreover, for example, as illustrated in FIG. 2, buffer layer 150 is disposed in the same layer as first electrode layer 120. Accordingly, light reflected off the top surface or the bottom surface of the above-described buffer layer 150 can be approximated to the light reflected off the top surface or the bottom surface of first electrode layer 120. Furthermore, since buffer layer 150 and first electrode layer 120 can be formed in the same process, manufacturing processes can be simplified and manufacturing costs can be reduced.

For example, similar to first electrode layer 120, buffer layer 150 is formed by forming an electrically conductive film on substrate 100 by deposition, application or sputtering, and patterning the formed electrically conductive film. Since they are formed in the same process, buffer layer 150 can easily be formed from the same material as first electrode layer 120 and formed to have the same thickness as first electrode layer 120.

However, here, in order to maintain electrical insulation between first electrode layer 120 and buffer layer 150, electrically insulating groove 160 is provided between first electrode layer 120 and buffer layer 150, as illustrated in FIG. 1B and FIG. 2. Electrically insulating groove 160 will be described later.

Note that the difference in optical path length may be a value other than zero. For example, so long as the difference in optical path length between the light-emitting region and the non-light-emitting region is an integral multiple of the half wavelength of incident light or a value approximate thereto, the phase difference may simply be reduced. Even in this case, an interference pattern is almost invisible.

(Absorption Spectrum)

Absorption spectrum is one example of an optical characteristic. Buffer layer 150 reduces a difference in absorption spectrum between first region 11 and second region 12 with respect to a predetermined light. More specifically, buffer layer 150 reduces a difference in absorption spectrum between the light-emitting region and the non-light-emitting region. The difference in absorption spectrum between the light-emitting region and the non-light-emitting region corresponds to the difference between the absorption spectrum of first electrode layer 120 and the absorption spectrum of buffer layer 150. Buffer layer 150 reduces the difference in absorption spectrum between first electrode layer 120 and itself.

For example, when the absorption coefficient of first electrode layer 120 with respect to a predetermined light is $\alpha1$ and the thickness of first electrode layer 120 is d1, the absorption spectrum amount of first electrode layer 120 is equal to $\alpha1 \times d1$. Note that the absorption coefficient differs depending on the wavelength of incident light.

More specifically, when buffer layer 150 includes a material having an absorption coefficient of $\alpha2$ with respect to a predetermined light, buffer layer 150 is designed to have a thickness d2 that reduces the difference between the absorption spectrum amount $\alpha1 \times d1$ of first electrode layer 120 and the absorption spectrum amount $\alpha2 \times d2$ of buffer layer 150. More specifically, buffer layer 150 may be designed to have a thickness d2 that is approximately equal to $d1 \times (\alpha1/\alpha2)$. For example, d2 may be a value that is in a range from 0.85 to 1.15 times the result of $d1 \times (\alpha1/\alpha2)$.

For example, when the absorption coefficient $\alpha1$ of first electrode layer 120 is 0.03 and the thickness d1 of first electrode layer 120 is 100 nm, the absorption spectrum amount with respect to first electrode layer 120 is 100 nm×0.03. Thus, the difference in absorption spectrum between the light-emitting region and the non-light-emitting region when buffer layer 150 does not include a non-light-emitting region is 100 nm×0.03. By providing buffer layer 150 having an absorption coefficient $\alpha2$ of 0.06 and a thickness d2 of 50 nm in the non-light-emitting region, the difference in absorption spectrum can be made to be approximately zero.

In this way, the thickness d2 of buffer layer 150 may be determined such that the absorption spectrum amount of first electrode layer 120 and the absorption spectrum amount of buffer layer 150 match. In other words, the thickness d2 of buffer layer 150 may be equal to $d1 \times (\alpha1/\alpha2)$. This makes it possible to inhibit a difference in color between the light-emitting region and the non-light-emitting region when organic EL element 10 is viewed straight on.

Thus, similar to the case with optical path length, for example, by forming buffer layer 150 from the same material as first electrode layer 120 and to have the same thickness as first electrode layer 120, the difference in absorption spectrum between buffer layer 150 and first electrode layer 120 can be made to be substantially zero.

Note that buffer layer 150 may include a material different from the material of first electrode layer 120. For example, buffer layer 150 may include a polyimide, acrylic, or novolac resin material. Alternatively, buffer layer 150 may include a metal thin film of aluminum or silver, for example.

Note that, for example, when buffer layer 150 includes a material different from the material of first electrode layer 120, in order to reduce both the difference in phase produced by a difference in optical path length and the difference in absorption spectrum, a material may be used such that the difference in optical path length is a value approximately equal to an integral multiple of the half wavelength of incident light.

More specifically, the thickness d2 of buffer layer 150 may be selected, from thicknesses that cause the difference in optical path length with first electrode layer 120 to be substantially equal to an integral multiple of the half wavelength of incident light, as a thickness that brings the difference in absorption spectrum close to zero. This makes it possible to reduce both the difference in phase produced by a difference in optical path length and the difference in absorption spectrum.

(Electrically Insulating Groove)

Electrically insulating groove 160 is a groove provided between first electrode layer 120 and buffer layer 150. Electrically insulating groove 160 provides electrical insulation between first electrode layer 120 buffer layer 150 by physically separating first electrode layer 120 and buffer layer 150. With this, power supplied from terminal 121 can be prevented from being supplied to buffer layer 150. In other words, with this, only first electrode layer 120 forms the light-emitting region.

As described above, electrically insulating groove 160 is formed by patterning an electrically conductive film. The patterning method is not limited to a particular method, and may be, for example, photolithography. Alternatively, laser light may be used to remove the portion of the electrically conductive film corresponding to electrically insulating groove 160, and the portion of the electrically conductive film corresponding to electrically insulating groove 160 may be removed physically (mechanically).

Moreover, as illustrated in FIG. 2, electrically insulating groove 160 tapers. In other words, the edge surface of first electrode layer 120 and the edge surface of buffer layer 150 are inclined with respect to the direction in which the layers are layered. More specifically, electrically insulating groove 160 is formed such that its width increases in a direction from substrate 100 toward substrate 110.

This makes it possible to inhibit step separation of top layer of electrically insulating groove 160. More specifically, this makes it possible to inhibit step separation of the layer forming planar light-emitting layer 140. This makes it possible to inhibit a short circuit between electrodes, for example, and improve the reliability of organic EL element 10.

Moreover, the optical characteristic of the region in which electrically insulating groove 160 is formed is different from the optical characteristic of first electrode layer 120 (the light-emitting region) and the optical characteristic of buffer layer 150 (the majority of the non-light-emitting region). As such, the width of electrically insulating groove 160 is preferably small. For example, the width L of electrically insulating groove 160 is 1.5 mm or less. This width refers to a width of a degree that is not recognizable to a person with 1.0 vision based on the Landolt ring test when viewed at a certain distance (for example, 5 meters).

(Conclusion)

As described above, organic EL element 10 according to this embodiment includes substrate 100 that is light-transmissive; a pair of electrode layers (first electrode layer 120 and second electrode layer 130) disposed above substrate 100, at least one of first electrode layer 120 and second electrode layer 130 being light-transmissive; and planar light-emitting layer 140 disposed between first electrode layer 120 and second electrode layer 130. First electrode layer 120 is disposed in first region 11 in a plan view. Organic EL element 10 further includes buffer layer 150 disposed, in a plan view, in second region 12 adjacent first region 11. Buffer layer 150 is for reducing a difference in an optical characteristic between first region 11 and second region 12 with respect to a predetermined light. Moreover, for example, first region 11 is a light-emitting region and second region 12 is a non-light-emitting region.

Figure 3:
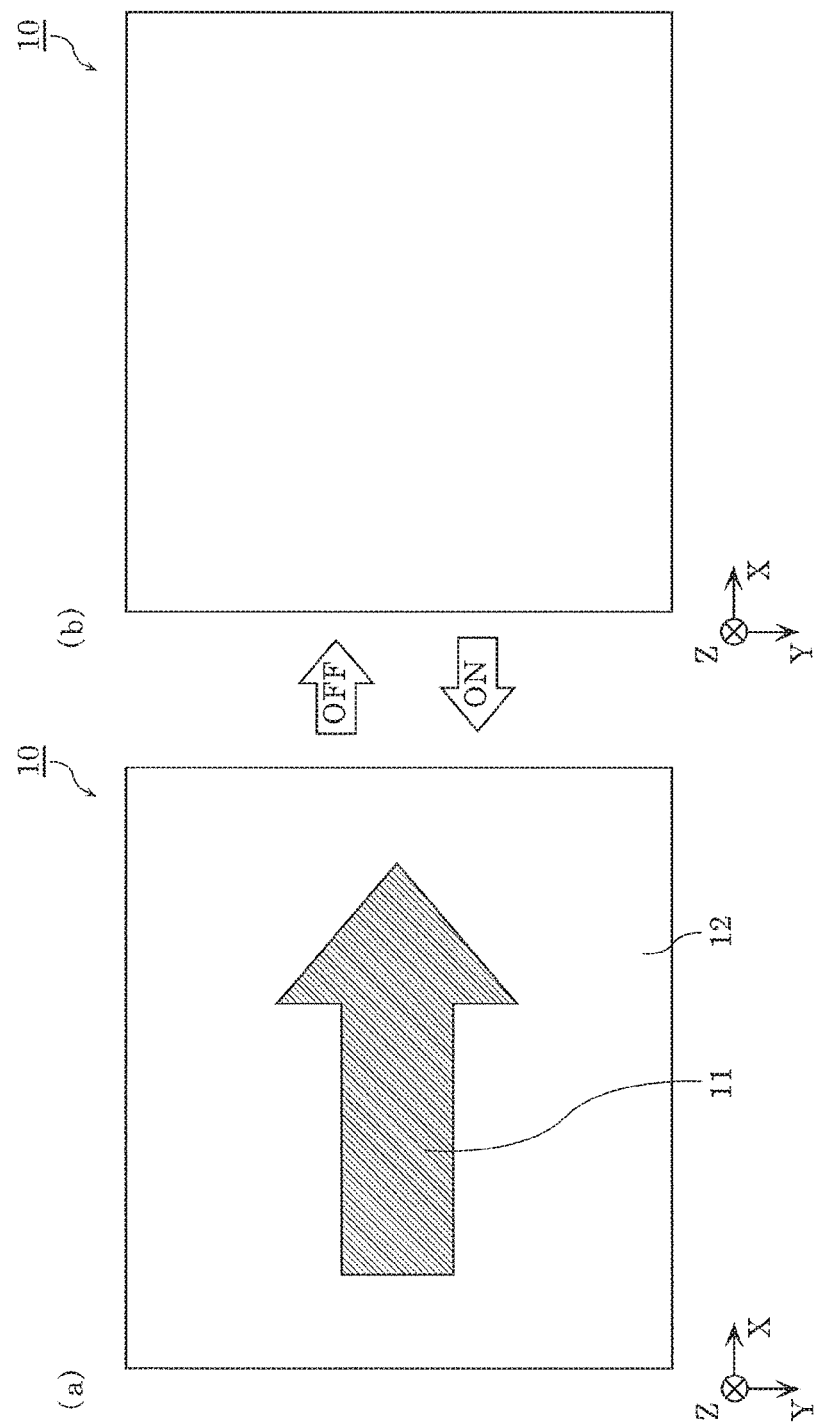
FIG. 3 illustrates in (a) and (b) an example of when the organic EL element according to Embodiment 1 of the present invention is turned on and an example of when the organic EL element according to Embodiment 1 of the present invention is turned off.

FIG. 3 illustrates an example of when organic EL element 10 according to this embodiment is turned on and an example of when organic EL element 10 according to this embodiment is turned off.

As illustrated in (a) in FIG. 3, at times when light is being emitted, light is emitted in the arrow shaped first region 11 (the light-emitting region). At times when light is not being emitted, since the difference in an optical characteristic between first region 11 (the light-emitting region) and second region 12 (the non-light-emitting region) is reduced, a design in which light is emitted—that is to say, the shape of first region 11—can be made to be difficult to see, as illustrated in (b) in FIG. 3.

In this way, since buffer layer 150 reduces a difference in an optical characteristic between first region 11 (the light-emitting region) and second region 12 (the non-light-emitting region), the design in which light is emitted can be inhibited from being visible at times when light is not being emitted. This in turn makes it possible to achieve a natural light-emitting surface at times when light is not being emitted—that is to say, display a planar surface which does not appear out of place to the viewer at times when light is not being emitted since the design in which light is emitted is substantially not visible.

Moreover, for example, buffer layer 150 reduces a difference in phase produced by a difference in optical path length between first region 11 and second region 12 with respect to a predetermined light.

This makes it possible to inhibit an interference pattern from forming between the light-emitting region and the non-light-emitting region since buffer layer 150 reduces a difference in phase produced by a difference in optical path length between the light-emitting region and the non-light-emitting region.

Moreover, for example, buffer layer 150 reduces a difference in absorption spectrum between first region 11 and second region 12 with respect to a predetermined light.

This makes it possible to inhibit a difference in color between the light-emitting region and the non-light-emitting region since buffer layer 150 reduces a difference in absorption spectrum between the light-emitting region and the non-light-emitting region.

Moreover, for example, buffer layer 150 is disposed in the same layer as first electrode layer 120.

This makes it possible to simplify manufacturing processes and reduce manufacturing costs since buffer layer 150 and first electrode layer 120 can be formed in the same process.

Moreover, for example, buffer layer 150 includes the same material and has the same thickness as first electrode layer 120.

This makes it simple to make an optical characteristic of buffer layer 150 and first electrode layer 120 the same since buffer layer 150 first electrode layer 120 include the same material and have the same thickness.

Moreover, for example, electrically insulating groove 160 is provided between first electrode layer 120 and buffer layer 150.

With this, power supplied to first electrode layer 120 can be prevented from being supplied to buffer layer 150 since buffer layer 150 and first electrode layer 120 are electrically insulated from one another.

Moreover, for example, electrically insulating groove 160 has a width of no more than 1.5 mm.

With this, for example, when a person with 1.0 vision is 5 meters or more away, electrically insulating groove 160 is not recognizable. Thus, when light is not being emitted, a more natural light-emitting surface can be shown.

Moreover, for example, buffer layer 150 reduces a difference in an optical characteristic between first region 11 second region 12 with respect to a predetermined light to 15% or less.

With this, for example, a person with 1.0 vision cannot recognize a difference in an optical characteristic between the light-emitting region and the non-light-emitting region when the background luminance is 1000 cd/m2. Thus, a more natural light-emitting surface can be shown at times when light is not being emitted.

Embodiment 2

Figure 4:
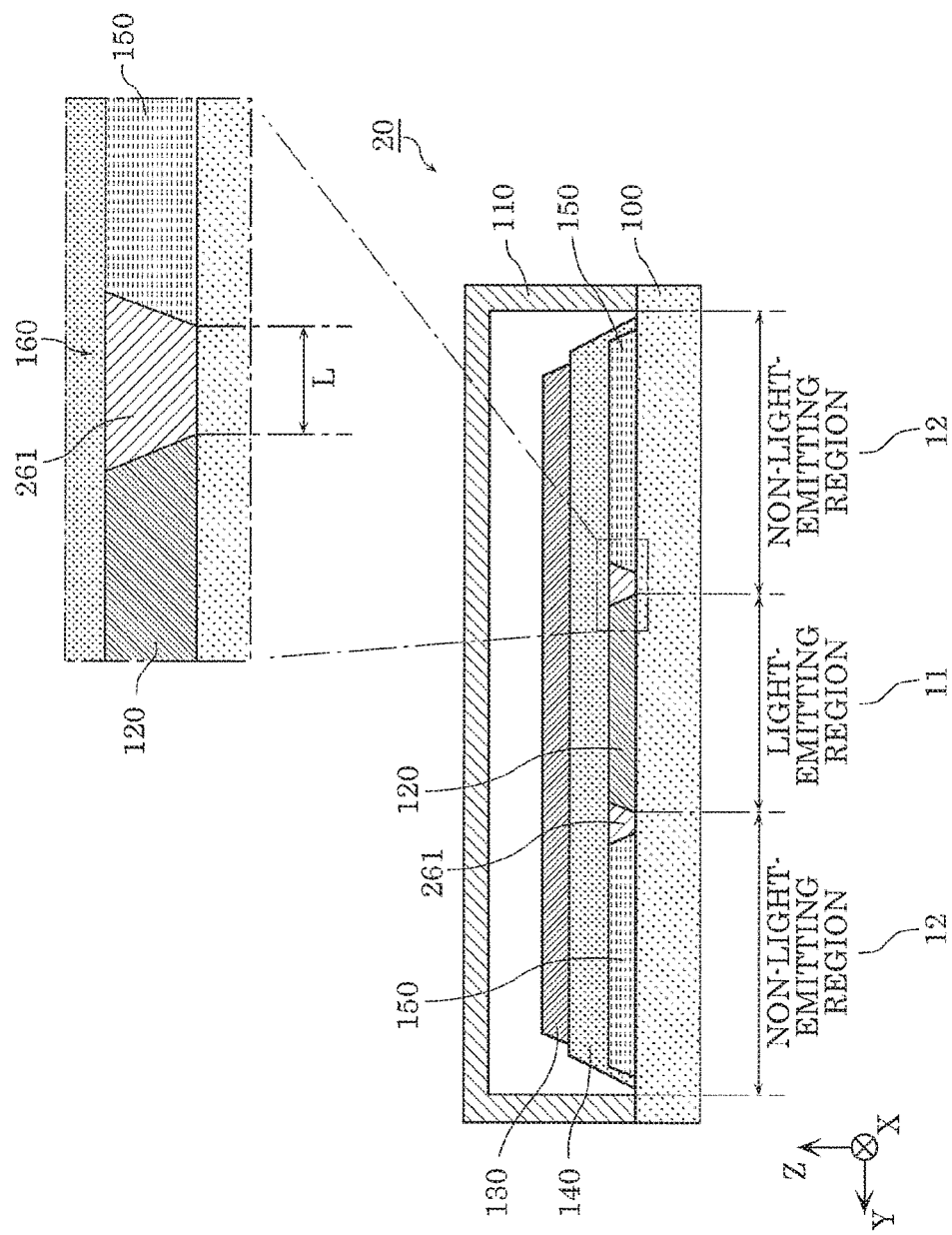
FIG. 4 is a cross sectional view of an organic EL element according to Embodiment 2 of the present invention.

Next, an organic EL element according to Embodiment 2 of the present invention will be described with reference to FIG. 4. FIG. 4 is a cross sectional view of organic EL element 20 according to this embodiment.

As illustrated in FIG. 4, organic EL element 20 according to this embodiment differs from organic EL element 10 illustrated in FIG. 2 in that organic EL element 20 includes electrically insulating layer 261. The following description will focus on this point of difference.

Electrically insulating layer 261 is disposed in electrically insulating groove 160. For example, electrically insulating groove 160 is filled with electrically insulating layer 261.

For example, electrically insulating layer 261 includes an electrically insulating resin that is light-transmissive, such as polyimide resin or acrylic resin. For example, electrically insulating layer 261 may be formed by applying an electrically insulating resin such as polyimide in electrically insulating groove 160 and heating the resin to cure the resin.

Alternatively, electrically insulating layer 261 may be silicon oxide or silicon nitride. In this case, electrically insulating layer 261 may be formed by forming a silicon oxide film by plasma chemical vapor deposition (CVD) and patterning the formed film.

There is substantially no difference in an optical characteristic between electrically insulating layer 261 and first region 11. More specifically, there is substantially no difference in phase produced by a difference in optical path length and no difference in absorption spectrum between electrically insulating layer 261 and first electrode layer 120 with respect to a predetermined light. In other words, electrically insulating layer 261 reduces the difference in phase produced by a difference in optical path length and the difference in absorption spectrum between first electrode layer 120 and electrically insulating layer 261, similar to buffer layer 150. More specifically, the thickness and material of electrically insulating layer 261 is determined in the same manner as buffer layer 150.

As described above, organic EL element 20 according to this embodiment further includes electrically insulating layer 261 that is disposed in electrically insulating groove 160 and has substantially no difference in phase produced by a difference in optical path length and absorption spectrum with first electrode layer 120.

With this, the difference in an optical characteristic between electrically insulating layer 261 and first region 11 (the light-emitting region) can be eliminated for the most part, and as such, it is possible to inhibit the shape of electrically insulating layer 261 from being visible at times when light is not being emitted. In other words, a more natural light-emitting surface can be displayed at times when light is not being emitted.

Embodiment 3

Next, an organic EL element according to Embodiment 3 of the present invention will be described with reference to FIG. 5A. FIG. 5A is a cross sectional view of organic EL element 30 according to this embodiment.

As illustrated in FIG. 5A, organic EL element 30 according to this embodiment differs from organic EL element 10 illustrated in FIG. 2 in that organic EL element 30 includes light-scattering unit 370. The following description will focus on this point of difference.

Light-scattering unit 370 is disposed in a boundary region between first region 11 (the light-emitting region) and second region 12 (the non-light-emitting region) in a plan view. More specifically, light-scattering unit 370 is disposed in a region overlapping with electrically insulating groove 160 in a plan view. For example, as illustrated in FIG. 5A, light-scattering unit 370 is formed on the entire surface of the light-emitting surface side of substrate 100. In other words, light-scattering unit 370 is throughout both the light-emitting region and the non-light-emitting region.

Light-scattering unit 370 scatters light passing therethrough. For example, light-scattering unit 370 is a light diffusing sheet or film with an uneven surface. Alternatively, light-scattering unit 370 may be formed by treating the light-emitting surface of substrate 100 to have a textured surface. Moreover, light-scattering unit 370 may be formed by mixing, for example, light-scattering particles in substrate 100.

As described above, organic EL element 30 according to this embodiment further includes light-scattering unit 370 disposed in a boundary region between first region 11 and second region 12 in a plan view.

With this, a difference in an optical characteristic in the boundary region can be made to be less visible as a result of light-scattering unit 370 scattering the light in the boundary region between the light-emitting region and the non-light-emitting region. Thus, a more natural light-emitting surface can be displayed at times when light is not being emitted.

Note that, as illustrated in FIG. 5B, light-scattering unit 370 may be disposed on the inner side of substrate 100 rather than the outer side of substrate 100. FIG. 5B is a cross sectional view of organic EL element 31 according to another example of this embodiment.

As illustrated in FIG. 5B, organic EL element 31 according to this variation differs from organic EL element 10 illustrated in FIG. 2 in that organic EL element 31 includes light-scattering unit 370 and planarizing film 380.

Planarizing film 380 is an electrically insulating film whose top surface is planar. Moreover, planarizing film 380 is light-transmissive. For example, planarizing film 380 includes an electrically insulating resin such as polyimide resin or acrylic resin. Planarizing film 380 is formed by applying an electrically insulating resin on substrate 100 and heating the resin to cure the resin.

Providing planarizing film 380 makes it possible to make the uneven surface of light-scattering unit 370 planar and accurately form first electrode layer 120, buffer layer 150, and planar light-emitting layer 140, for example. In other words, a high-quality planar light-emitting layer 140 can be formed.

Even in the example illustrated in FIG. 5B, a difference in an optical characteristic in the boundary region can be made to be less visible as a result of light-scattering unit 370 scattering the light in the boundary region between the light-emitting region and the non-light-emitting region. Thus, a more natural light-emitting surface can be displayed at times when light is not being emitted. Note that light-scattering unit 370 may be disposed on the entire surface in organic EL element 31 illustrated in FIG. 5B as well.

Embodiment 4

Figure 6:
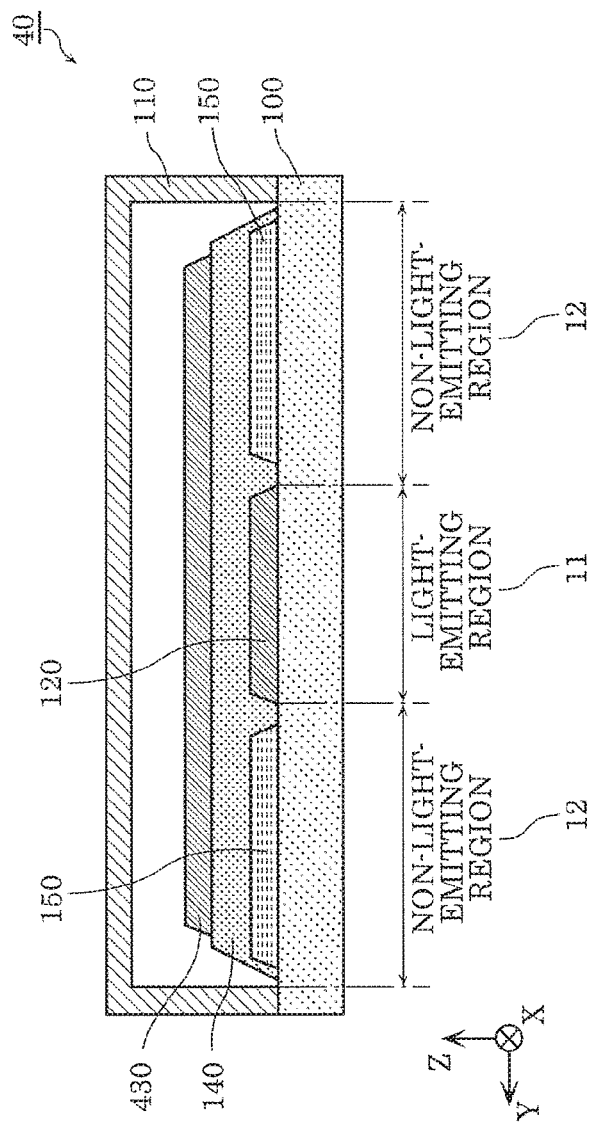
FIG. 6 is a cross sectional view of an organic EL element according to Embodiment 4 of the present invention.

Next, an organic EL element according to Embodiment 4 of the present invention will be described with reference to FIG. 6. FIG. 6 is a cross sectional view of organic EL element 40 according to this embodiment.

As illustrated in FIG. 6, organic EL element 40 according to this embodiment differs from organic EL element 10 illustrated in FIG. 2 in that organic EL element 40 includes second electrode layer 430 instead of second electrode layer 130. The following description will focus on this point of difference.

Second electrode layer 430 is different from second electrode layer 130 in that it is light-transmissive. For example, second electrode layer 430 includes a light-transmissive, electrically conductive material that transmits at least some rays of visible light. Second electrode layer 430 includes, for example, indium tin oxide (ITO), IZO, or AZO. Note that second electrode layer 430 may be a metal thin film, such as a film of silver or aluminum that is thin enough to transmit light. Second electrode layer 430 may be made by dispersing silver nanowires or silver particles. Moreover, second electrode layer 430 may include electrically conductive high molecules such as PEDOT or polyaniline, electrically conductive high molecules doped with, for example, a given acceptor, or an electrically conductive, light-transmissive material such as carbon nanotubes. For example, second electrode layer 430 is formed by forming a light-transmissive, electrically conductive film on planar light-emitting layer 140 by deposition, application or sputtering.

Note that in this embodiment, substrate 110 is also light-transmissive. When substrate 110 is light-transmissive, the shape of first region 11 at times when light is not being emitted is easier to see, which increases the effect of the reduction of the difference in an optical characteristic.

As described above, with organic EL element 40 according to this embodiment, both first electrode layer 120 and second electrode layer 430 are light-transmissive.

Figure 7:
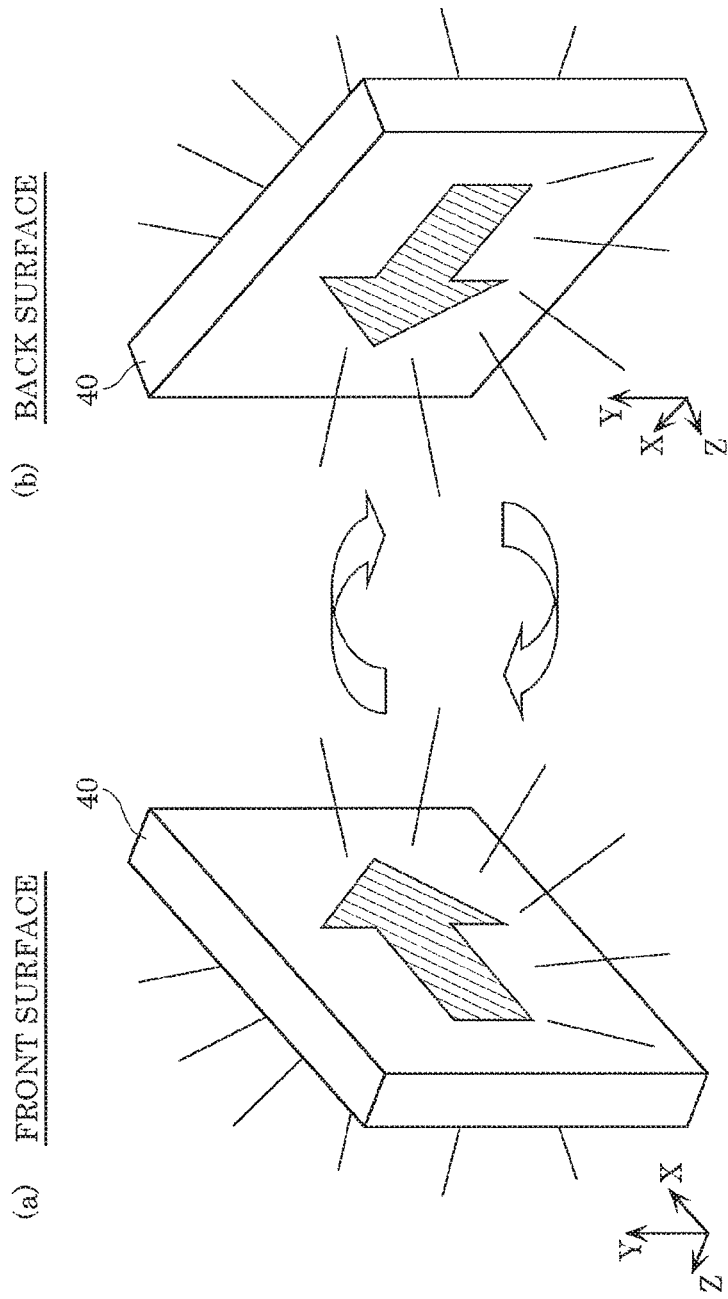

FIG. 7 illustrates an example of when organic EL element 40 according to this embodiment is turned on. As illustrated in FIG. 7, it is possible to tell that light is being emitted in the light-emitting region from both the front and back sides of organic EL element 40. Since organic EL element 40 is see-through at times when light is not being emitted, it is possible to use organic EL element 40, for example, as a window of a building. In other words, at times when light is not being emitted, organic EL element 40 can be used as a normal "window", and at times when light is being emitted, organic EL element 40 can be used as, for example, a lighted signboard or digital signage for displaying information by emitting light in a predetermined shape.

Embodiment 5

Figure 8:
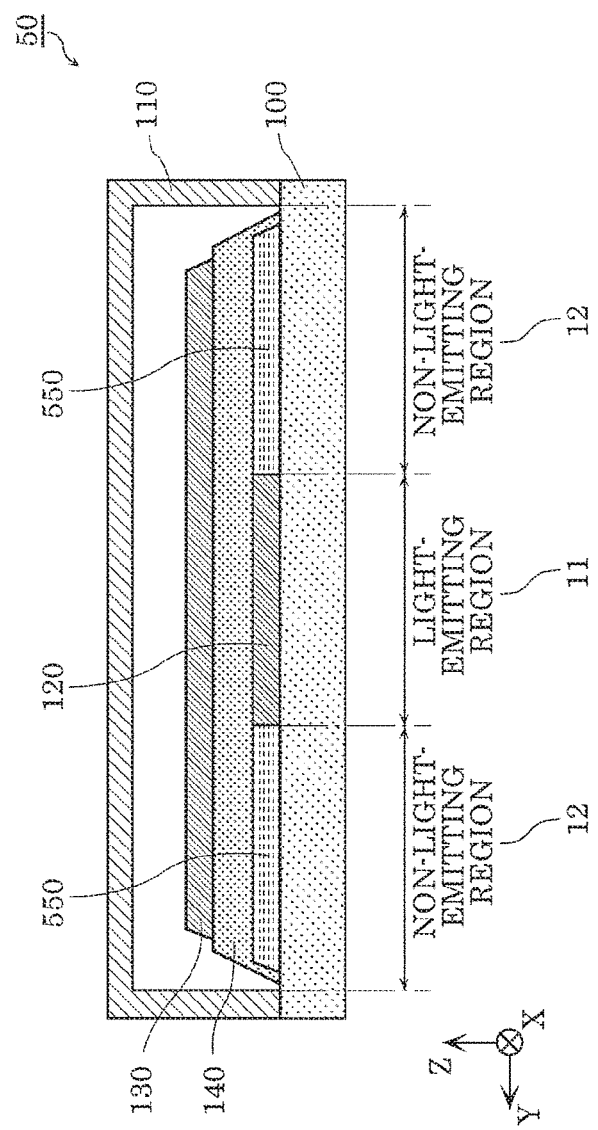
FIG. 8 is a cross sectional view of an organic EL element according to Embodiment 5 of the present invention.

Next, an organic EL element according to Embodiment 5 of the present invention will be described with reference to FIG. 8. FIG. 8 is a cross sectional view of organic EL element 50 according to this embodiment.

As illustrated in FIG. 8, organic EL element 50 according to this embodiment differs from organic EL element 10 illustrated in FIG. 2 in that organic EL element 50 includes buffer layer 550 instead of buffer layer 150 and does not include electrically insulating groove 160. The following description will focus on this point of difference.

Since electrically insulating groove 160 is not included in this embodiment, first electrode layer 120 and buffer layer 550 are in contact with one another. As such, buffer layer 550 includes an electrically insulating material.

In contrast to buffer layer 150, buffer layer 550 includes an electrically insulating material. The functions and such of buffer layer 550 are the same as buffer layer 150.

Buffer layer 550 includes a material different from the material of first electrode layer 120. Thus, as described in Embodiment 1, the thickness of buffer layer 550 is determined in accordance with the refractive index of the material used for buffer layer 550.

As described above, with organic EL element 50 according to this embodiment, buffer layer 550 includes an electrically insulating material.

With this, electrically insulating groove 160 may be omitted, which means that the shape of electrically insulating groove 160 is not visible at times when light is not being emitted. Thus, a more natural light-emitting surface can be displayed at times when light is not being emitted.

Embodiment 6

Figure 9:
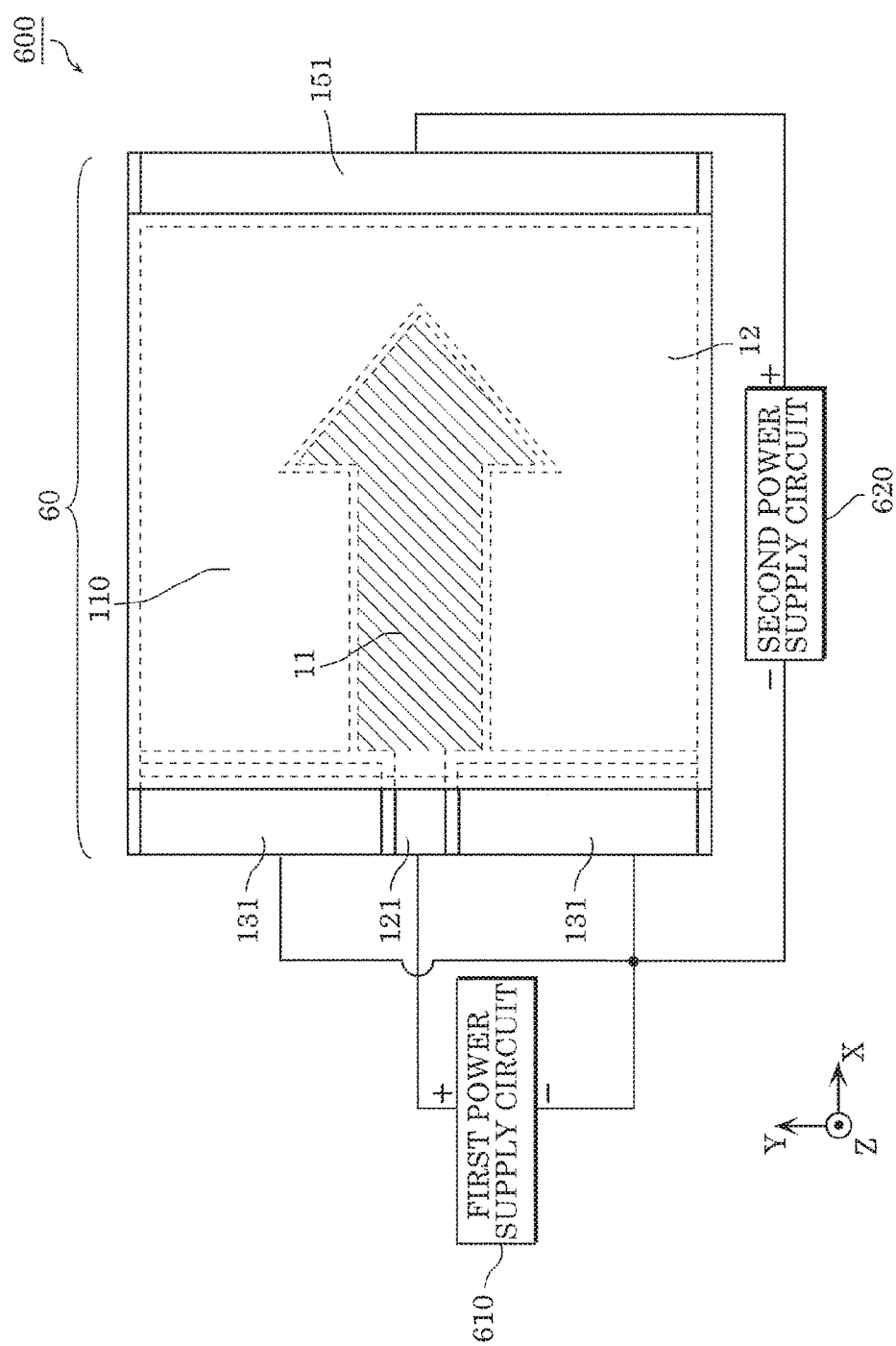
FIG. 9 illustrates a lighting device according to Embodiment 6 of the present invention.

Next, a lighting device according to Embodiment 6 of the present invention will be described with reference to FIG. 9. FIG. 9 illustrates lighting device 600 according to this embodiment.

As illustrated in FIG. 9, lighting device 600 according to this embodiment includes organic EL element 60, first power supply circuit 610, and second power supply circuit 620. In organic EL element 60 and lighting device 600 according to this embodiment, first region 11 and second region 12 are capable of emitting light independently from one another. In other words, not just first region 11, but second region 12 is also a light-emitting region of organic EL element 60.

In contrast to organic EL element 10 illustrated in FIG. 1A and FIG. 2, organic EL element 60 includes terminal 151. The following description will focus on this point of difference.

Terminal 151 is disposed on substrate 100. Terminal 151 is an extraction electrode for supplying power to buffer layer 150.

In other words, terminal 151 is electrically connected to buffer layer 150. Note that buffer layer 150 includes an electrically conductive material, and, for example, includes the same material as first electrode layer 120 and has the same thickness as first electrode layer 120.

For example, terminal 151 is disposed so as to be an extension of part of buffer layer 150. Terminal 151 is formed by patterning an electrically conductive film in the same process as buffer layer 150. Thus, for example, terminal 151 includes the same material as buffer layer 150. Note that terminal 151 may be formed in a different process from buffer layer 150, and may be formed of a different material than buffer layer 150. For example, terminal 151 may be formed at the same time as terminal 131 is formed.

With this, buffer layer 150 functions as a second anode of planar light-emitting layer 140 (not that first electrode layer 120 is the first anode). By supplying buffer layer 150 with power, the region in which buffer layer 150 is disposed—that is to say, second region 12—can be caused to emit light.

First power supply circuit 610 is disposed between terminal 121 and terminal 131. First power supply circuit 610 is a direct current or direct voltage power supply connected to terminal 121 and terminal 131, and applies a predetermined voltage or current between first electrode layer 120 and second electrode layer 130. With this, the region in which first electrode layer 120 is disposed—that is to say, first region 11—can be caused to emit light.

Second power supply circuit 620 is disposed between terminal 151 and terminal 131. Second power supply circuit 620 is a direct current or direct voltage power supply connected to terminal 151 and terminal 131, and applies a predetermined voltage or current between buffer layer 150 and second electrode layer 130. With this, second region 12 can be caused to emit light.

First power supply circuit 610 and second power supply circuit 620 can operate independently from one another. With this, first region 11 and second region 12 can be independently caused to emit light at respective timings.

Figure 10:
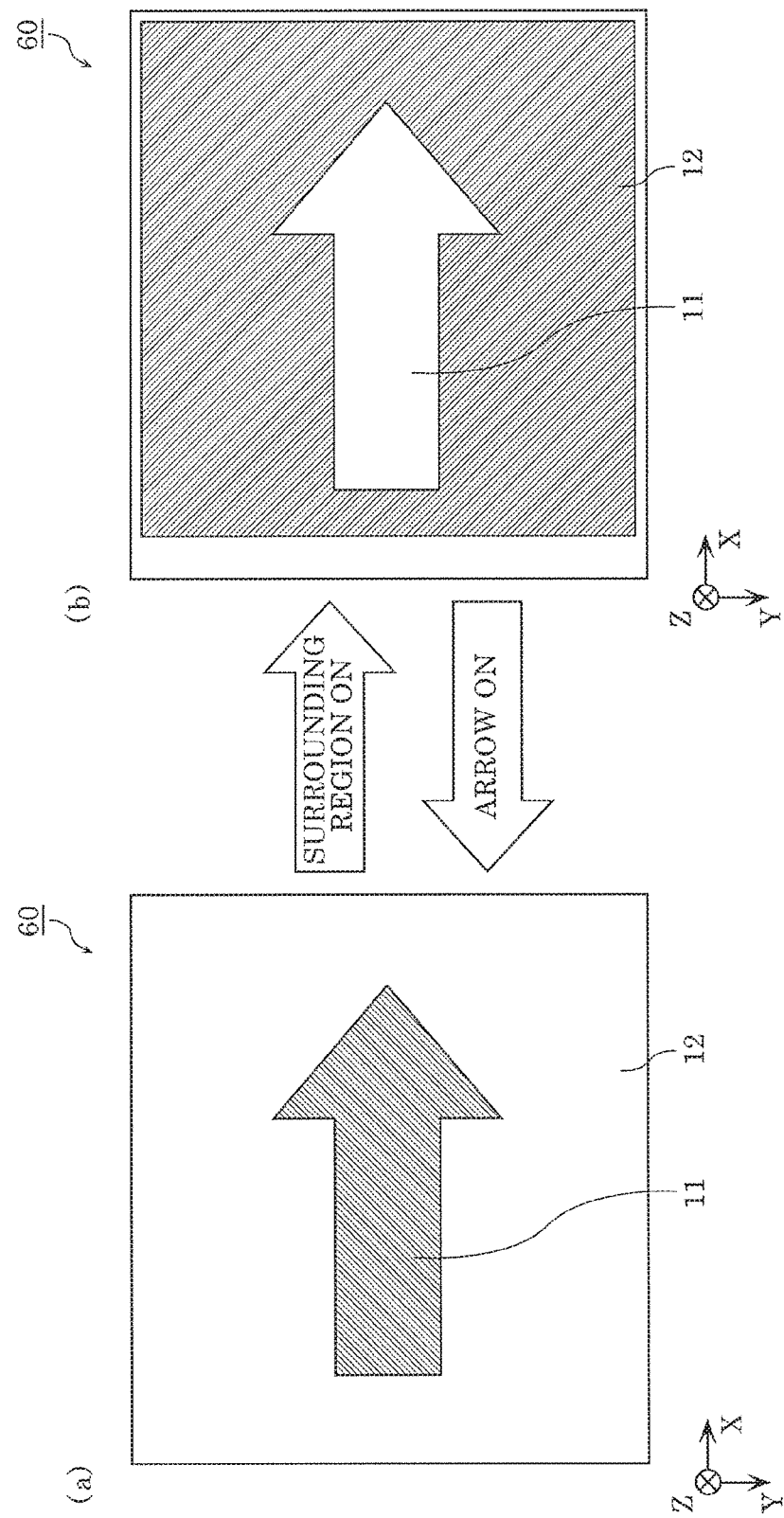

FIG. 10 illustrates an example when lighting device 600 according to this embodiment is turned on. For example, as illustrated in (*a*) in FIG. 10, by supplying power to only first power supply circuit 610, light can be emitted in only first region 11. Moreover, as illustrated in (*b*) in FIG. 10, by supplying power to only second power supply circuit 620, light can be emitted in only second region 12.

As described above, with organic EL element 60 according to this embodiment, first region 11 and second region 12 are capable of emitting light independently from one another.

With this, for example, the region to illuminate light can be changed depending on the situation. Since the shape of first region 11 does not change, by causing either one of first region 11 and second region 12 to emit light, the same shape (for example, an arrow) can be seen.

Note that first region 11 and second region 12 may be caused to emit light concurrently. For example, first region 11 and second region 12 may be caused to emit light of a different color or different intensity.

Note that the arrangement of terminals 121, 131, and 151 illustrated in FIG. 9 is merely one example. For example, terminals 121, 131, and 151 may all be provided on the same side.

(Additional Comments)

Hereinbefore, the organic EL element and lighting device according to the present invention have been described based on the above embodiments, but the present invention is not limited to the above embodiments.

For example, in the above embodiments, in-plane, one first electrode layer 120—that is to say, one light-emitting region—is provided, but this example is not limiting. The organic EL element according to one aspect of the present invention may include a plurality of first electrode layers 120. Stated simply, a symbol such as an arrow or a letter or character may be provided in plurality and emit light.

Moreover, for example, in the above embodiments, first electrode layer 120 is patterned into a predetermined shape, and second electrode layer 130 is formed on the entire surface, but this example is not limiting. For example, second electrode layer 130 may be patterned into a predetermined shape, and first electrode layer 120 may be formed on the entire surface. In this case, buffer layer 150 may be provided in the same layer as second electrode layer 130. In other words, buffer layer 150 may be provided in the same layer as one of the pair of electrodes—that is to say, one of first electrode layer 120 and second electrode layer 130.

Moreover, for example, in the above embodiments, buffer layer 150 is provided in the same layer as first electrode layer 120, but this example is not limiting. Buffer layer 150 may be provided in a different layer than first electrode layer 120. For example, buffer layer 150 may be provided between planar light-emitting layer 140 and second electrode layer 130. Alternatively, buffer layer 150 may be provided on the outer side of substrate 100 and substrate 110.

Moreover, for example, in the above embodiments, electrically insulating groove 160 has a width of 1.5 mm or less, but this example is not limiting. For example, depending on the location in which organic EL element 10 is installed, even if electrically insulating groove 160 has a width of greater than 1.5 mm, electrically insulating groove 160 will not stand out. For example, when organic EL element 10 is installed in a high location on a building, it can be supposed that organic EL element 10 will be viewed from a significant distance, and as such, electrically insulating groove 160 may have a width of greater than 1.5 mm. Similarly, the difference in optical characteristic may be greater than 15%.

Moreover, for example, in Embodiment 6, lighting device 600 is described in which both first region 11 and second region 12 emit light, but when lighting device 600 only includes first region 11 as a light-emitting region, similar to in Embodiments 1 through 5, lighting device 600 may include only first power supply circuit 610.

Moreover, for example, in the above embodiments, first electrode layer 120 is an anode and second electrode layer 130 is a cathode, but this relationship may be reversed. In other words, first electrode layer 120 may be a cathode, and second electrode layer 130 may be an anode.

Moreover, for example, in the above embodiments, organic EL element has a plan view shape of a rectangle, but this example is not limiting. Organic EL element may have, in a plan view, a closed shape drawn with straight or curved lines, such as a polygon, circle or ellipse, for example.

Those skilled in the art will readily appreciate that various modifications to the above embodiments conceivable by those skilled in the art, including those achieved by combining elements and functions from the above embodiments, are possible without materially departing from the novel teachings and advantages of this invention. Accordingly, all such modifications are intended to be included within the scope of this invention.

The invention claimed is:

1. An organic electroluminescent element, comprising:
    a substrate that is light-transmissive;
    a first electrode layer and a second electrode layer disposed opposite each other and above the substrate, at least one of the first electrode layer and second electrode layer being light-transmissive; and
    a planar light-emitting layer disposed between the first electrode layer and the second electrode layer, wherein
    the first electrode layer is patterned and is disposed in a first region in a plan view,
    the organic electroluminescent element further comprises a buffer layer disposed, in the plan view, in a second region adjacent the first region, the buffer layer reduces a difference in an optical characteristic between the first region and the second region with respect to a predetermined light,
    the buffer layer and the first electrode layer include different materials;
    the buffer layer reduces a difference in phase produced by a difference in an optical path length between the first region and the second region with respect to the predetermined light,
    the first electrode layer is an anode layer, and
    a thickness of the buffer layer is different than a thickness of the anode layer, and is set to cause the difference in the optical path length with the anode layer to be substantially equal to an integral multiple of a half wavelength of the predetermined light.

2. The organic electroluminescent element according to claim 1, wherein the buffer layer reduces a difference in absorption spectrum between the first region and the second region with respect to the predetermined light.

3. The organic electroluminescent element according to claim 1, wherein the buffer layer is disposed in the same layer as the first electrode layer.

4. The organic electroluminescent element according to claim 3, wherein an electrically insulating groove is provided between the first electrode layer and the buffer layer.

5. The organic electroluminescent element according to claim 4, further comprising an electrically insulating layer that is disposed in the electrically insulating groove and has substantially no difference in phase produced by a difference in optical path length and no difference in absorption spectrum with the first electrode layer.

6. The organic electroluminescent element according to claim 4, wherein the electrically insulating groove has a width of no more than 1.5 mm.

7. The organic electroluminescent element according to claim 1, wherein the buffer layer reduces the difference in the optical characteristic between the first region and the second region with respect to the predetermined light to 15% or less.

8. The organic electroluminescent element according to claim 1, further comprising a light-scattering substance disposed in a boundary region between the first region and the second region in the plan view.

9. The organic electroluminescent element according to claim 1, wherein the first electrode layer and the second electrode layer are both light-transmissive.

10. The organic electroluminescent element according to claim 1, wherein
the first region is a light-emitting region, and
the second region is a non-light-emitting region.

11. The organic electroluminescent element according to claim 10, wherein the buffer layer includes an electrically insulating material.

12. The organic electroluminescent element according to claim 1, wherein the first region and the second region are configured to emit light independently from one another.

13. A lighting device including the organic electroluminescent element according to claim 1.

14. The organic electroluminescent element according to claim 1, wherein
the planar light-emitting layer entirely covers the first electrode layer and the buffer layer.

15. The organic electroluminescent element according to claim 1, wherein
the different materials differ in refractivity.

16. The organic electroluminescent element according to claim 1, a pattern of the first electrode layer comprises a predetermined shape such that the planar light-emitting layer emits light in the predetermined shape.

17. An organic electroluminescent element, comprising:
a substrate that is light-transmissive;
a first electrode layer and a second electrode layer disposed above the substrate, at least one of the first electrode layer and the second electrode layer being light-transmissive; and
a planar light-emitting layer disposed between the first electrode layer and the second electrode layer, wherein the first electrode layer is disposed in a first region in a plan view,
the organic electroluminescent element further comprises a buffer layer disposed, in the plan view, in a second region adjacent the first region, the buffer layer being for reducing a difference in an optical characteristic between the first region and the second region with respect to a predetermined light,
an electrically insulating groove is provided between the first electrode layer and the buffer layer, and
an electrically insulating layer is disposed in the electrically insulating groove, and
the electrically insulating layer has substantially no difference in phase produced by a difference in optical path length and no difference in absorption spectrum with the first electrode layer.

18. The organic electroluminescent element according to claim 17, wherein the buffer layer includes a same material and has a same thickness as the first electrode layer.

19. The organic electroluminescent element according to claim 17, wherein the buffer layer reduces the difference in the optical characteristic between the first region and the second region, with respect to the predetermined light, to 15% or less.

20. The organic electroluminescent element according to claim 17, further comprising a light scattering substance provided in a boundary region between the first region and the second region in the plan view.

* * * * *